US008236386B2

(12) United States Patent
Zach (10) Patent No.: US 8,236,386 B2
(45) Date of Patent: Aug. 7, 2012

(54) NANOWIRE AND MICROWIRE FABRICATION TECHNIQUE AND PRODUCT

(75) Inventor: Michael Zach, Stevens Point, WI (US)

(73) Assignee: WiSys Technology Foundation, Madison, WI (US)

( * ) Notice: Subject to any disclaimer, the term of this patent is extended or adjusted under 35 U.S.C. 154(b) by 682 days.

(21) Appl. No.: 12/358,801

(22) Filed: Jan. 23, 2009

(65) Prior Publication Data

US 2009/0242016 A1    Oct. 1, 2009

Related U.S. Application Data

(60) Provisional application No. 61/023,280, filed on Jan. 24, 2008, provisional application No. 61/033,580, filed on Mar. 4, 2008, provisional application No. 60/073,171, filed on Jun. 17, 2008, provisional application No. 60/081,241, filed on Jul. 16, 2008, provisional application No. 61/088,415, filed on Aug. 13, 2008.

(51) Int. Cl.
*B05D 1/04* (2006.01)
*C25D 1/04* (2006.01)

(52) U.S. Cl. .......................... 427/458; 205/76
(58) Field of Classification Search ............ 427/458; 204/76
See application file for complete search history.

(56) References Cited

U.S. PATENT DOCUMENTS

| | | | | |
|---|---|---|---|---|
| 6,843,902 B1 * | 1/2005 | Penner et al. | ............ | 205/76 |
| 7,220,346 B2 * | 5/2007 | Penner et al. | ............ | 205/76 |
| 2004/0055892 A1 * | 3/2004 | Oh et al. | ............ | 205/109 |

OTHER PUBLICATIONS

Zach, Michael P., et al., Molybdenum Nanowires by Electrodeposition, Science, Dec. 15, 2000, vol. 290, pp. 2120-2123, American Association for the Advancement of Science, Washington, DC, USA.
E.J. Menke, et al., Lithographically Patterned Nanowire Electrodeposition, Nature Materials, vol. 5, pp. 914-919, Nov. 2006 (published online Oct. 22, 2006), Nature Publishing Group, New York, NY, USA.
Menard, Etienne, et al., Micro- and Nanopatterning Techniques for Organic Electronic and Optoelectronic Systems, Chemical Reviews, Apr. 11, 2007, vol. 107, pp. 1117-1160, American Chemical Society, Washington, DC, USA.
Smythe, Elizabeth J., et al., A Technique to Transfer Metallic Nanoscale Patterns to Small and Non-Planar Surfaces, ACS Nano, 2009, vol. 3, No. 1, pp. 59-65, American Chemical Society, Washington, D.C., USA.
Xu, Qiaobing, et al., Nanoskiving: A New Method to Produce Arrays of Nanostructures, Accounts of Chemical Research, Dec. 2008, vol. 41, No. 12, pp. 1566-1577, American Chemical Society, Washington, D.C., USA.
Beckman, R.A., et al., Fabrication of Conducting Si Nanowire Arrays, Journal of Applied Physics, Nov. 15, 2004, vol. 96, No. 10, pp. 5921-5923, American Institute of Physics, College Park, Maryland, USA.
Xiang, Chengxiang, et al., Lithographically Patterned Nanowire Electrodeposition, Physica Status Solidi, (c) 5, No. 11, 3503-3505, 2008, Wiley InterScience, Wiley-VCH Verlag Gmbh & Co., Malden, MA, USA.

* cited by examiner

*Primary Examiner* — Frederick Parker
(74) *Attorney, Agent, or Firm* — Boyle Fredrickson, S.C.

(57) ABSTRACT

A method of fabricating nanowires or microwires employs a robust conductive surface whose edges define electrodes for promoting electrochemical deposition of nanowire material at those edges. Controlled deposition times and thin conductive layers allow extremely small diameter wires to be created and then removed without destruction of the pattern and the wires to be applied to a second substrate or used for composite materials.

10 Claims, 9 Drawing Sheets

NANOWIRE AND MICROWIRE FABRICATION TECHNIQUE AND PRODUCT

CROSS REFERENCE TO RELATED APPLICATION

This application claims the benefit of U.S. provisional applications 61/023,280 filed Jan. 24, 2008; 61/033,580 filed Mar. 4, 2008; 61/073,171 filed Jun. 17, 2008; 61/081, 241 filed Jul. 16, 2008; and 61/088,415 filed Aug. 13, 2008 all hereby incorporated by reference.

STATEMENT REGARDING FEDERALLY SPONSORED RESEARCH OR DEVELOPMENT

Background of the Invention

The present invention relates generally to nanotechnology and in particular to a method of creating metallic and semi-conducting nanowires, heterogeneous nanowires, and nanowire assemblies using a technique suitable for mass production.

Conductive, semi-conductive, and insulating nanowires hold great promise for the creation of new devices including small-scale electrical circuit elements, sensors, and the like. Of particular interest in this regard are metallic nanowires. The creation of relatively long molybdenum nanowires is described in a paper authored by the present inventor and published in Science 2001, 290, (5499), 2120-2123 hereby incorporated by reference. This particular fabrication technique employed highly oriented pyrolytic graphite (HOPG) as a substrate. Nanowires were formed through electrochemical step edged decoration (ESED) techniques in which edges on a terraced surface of the HOPG provided a deposition site for the electrochemically deposited nanowires following those edges.

Fabricating devices from nanoconductors can be difficult. In the above ESED technique, the produced nanowires have irregular orientation resulting from the difficulty of controlling the geometry of the step edges on the HOPG substrate. These variations also affect, to a lesser degree, the diameter of the wires produced. Production of the nanowires is further hampered by the fragile nature and expense of the HOPG. HOPG also contains numerous defects that result in particles forming in between the wires.

Nanowires have been fabricated by using a pocket formed under a layer of photoresist between the photoresist and a substrate as separated by a nanothickness layer of nickel. See "Lithographically Patterned Nanowire Electrodeposition", E. J. Menke et al, Nature Materials 5, 914-919 (2006). This technique makes use of an edge of a larger pattern to define the location of the nanowire eliminating a need for nanoscale line widths in generating the pattern.

SUMMARY OF THE INVENTION

The present invention provides a method of fabricating small-scale conductors and semiconductors using ESED at a step edge formed by a conductive crystalline diamond, including micro, nano and ultra nano crystalline diamond. This diamond may be patterned by common integrated circuit techniques used in a novel manner and producing not only a well-defined edge, allowing precise dimensions and orientation of the wire to be maintained, but also a robust template surface with relatively low cohesion with the wire allowing the wires, once grown, to be removed and transferred to a different substrate.

This transfer may be done by a transfer pad allowing mass production of patterned wire circuits or devices by a cyclic stamping process. The transfer process further permits the combination of patterned wire elements from multiple templates to provide for complex interconnections among wires that could not be created directly by ESED. The crystalline diamond permits the formation of complex templates having electrically independent conductive elements allowing the material of the wires to be varied along their lengths permitting the generation of heterogeneous junctions or the like for the production of electronic elements.

Specifically, the present invention provides a method of constructing small scale wires in which a pattern of conductive diamond is prepared having edges at the desired locations of wires. The pattern is immersed in a solution containing an electrochemically depositable material, and the application of an electrical potential between the conductive diamond and the solution is used to electrically deposit the material along the edge to grow the wire.

It is thus a feature of at least one embodiment of the invention to provide for the formation of nanoscale wires using a diamond pattern that may have a much larger dimension than the wires. Because only the thickness of the electrode layer determines the minimum wire diameter, the growth time will limit the overall diameter and since the pattern edges define the only the location of the wires and not the diameter, the pattern features can be much wider and still allow wire growth.

An insulating coating may be applied over the pattern. The layered electrode may then be cut exposing at least one edge of the buried conductive layer.

It is therefore a feature of at least one embodiment of the invention to block electrochemical deposition except at the edges of the pattern.

The conductive diamond may be diamond incorporating a doping material and the insulating coating may also be diamond but without the doping material.

It is thus a feature of at least one embodiment of the invention to provide a simple fabrication process that may use multiple layers of diamond with different doping.

The method may include the step of transferring the nanoconductors from the diamond to a second substrate.

It is thus a feature of at least one embodiment of the invention to permit the reuse of the diamond for multiple sets of wire formation.

The transfer process may use a cohesive material applied to the wires on the substrate and removed from the substrate material to pull the wires from the substrate. The cohesive material and wires may then be applied to the second substrate and the cohesive material removed, leaving the wires on the second substrate.

It is thus a feature of at least one embodiment of the invention to provide a reusable patterned substrate to be used to generate devices having wires.

The transfer process may be repeated multiple times for a given pattern and different substrates.

Thus, it is a feature of at least one embodiment of the invention to provide a fabrication technique for nanostructures amenable to mass production in which the pattern is not destroyed.

Alternatively, the transfer may apply a material to the wires on the substrate and remove the material to pull the wires from the first substrate where the material is retained on the second substrate.

It is thus a feature of at least one embodiment of the invention to permit extraction of the wires by material that does not lend itself to cohesive release.

The process of depositing materials may be repeated to produce a heterogeneous nanoconductor.

It is thus a feature of at least one embodiment of the invention to permit complex electrical devices and heterogeneous wires to be fabricated by this technique.

The pattern of conductive diamond may include multiple electrically conductive portions separated by insulated portions, and the method may include immersing the pattern in at least one solution containing an electrochemically depositable second material and controlling the application of an electrical potential between the second conductive portion and the second solution to electrically deposit the second material to be in electrical communication with the first material.

It is thus a feature of at least one embodiment of the invention to be able to controllably vary the material of the wires by multiplexing of multiple adjacent conductive segments.

These particular features and advantages may apply to only some embodiments falling within the claims and thus do not define the scope of the invention.

DETAILED DESCRIPTION OF THE PREFERRED EMBODIMENT

Construction of Small Scale Wires

Figure 1A:
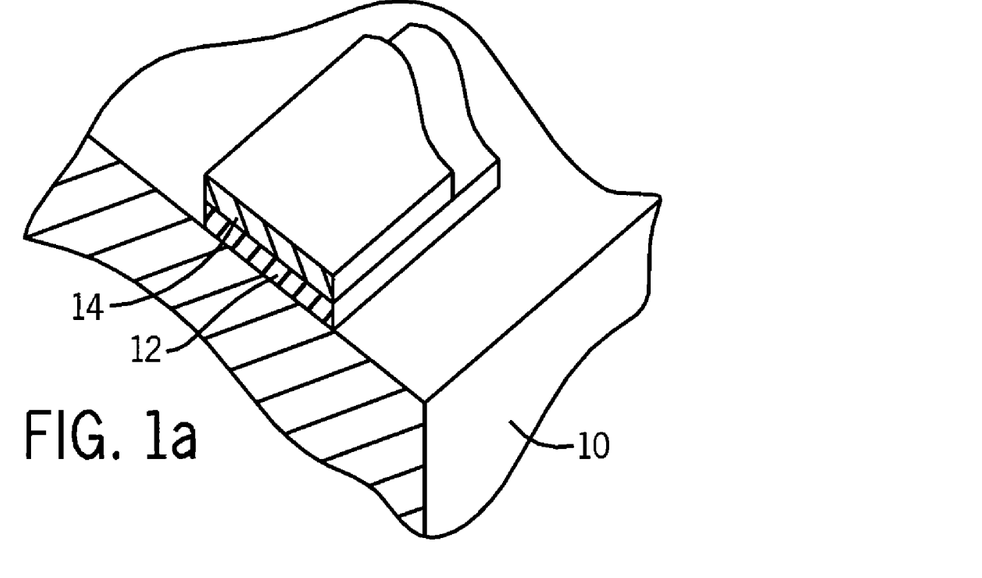
FIGS. 1a and 1b are a fragmentary, perspective, cross-sectional views of an ultra nano crystalline diamond (UNCD) template used to grow to small-scale wires by electro-deposition per the present invention before and after the electrode deposition.

Referring now to FIG. 1a, the present invention may employ a generally planar substrate 10, for example, a silicon wafer having an upper insulating surface of silicon dioxide, or sapphire, or quartz wafer. A layer 12 of conductive ultra nano crystalline diamond (UNCD) may be formed on the substrate 10 using an intervening layer of tungsten or molybdenum (not shown) plated or sputtered on the surface of the substrate 10. This layer 12 of ultra nano crystalline diamond may be a few nanometers thick measured in a direction perpendicular to the plane of the substrate 10.

The layer 12 may be patterned using conventional lithography techniques following predefined mask artwork. For example, the generation of the patterned layer 12 may, employ photoresist techniques to apply copper (not shown) to the substrate 10 as a negative image of the patterned layer 12. A layer of UNCD may then be applied over the exposed areas of the substrate 10. UNCD growth on copper is poor The UNCD forming on the copper layer may be removed by dissolving the copper in between the patterned layer 12 removed by chemical etching to leave the patterned layer of UNCD 12. Alternatively, the patterned layer 12 may be patterned by using reactive ion etching or other similar technique.

Preferably before the removal of the copper, an insulating layer 14, for example, nonconducting UNCD, may be placed over the patterned layer 12 covering its surface and optionally one edge. The insulating layer 14 may be insulating by virtue of the lack of doping of the diamond of the layer 14, in contrast, the layer 12 may be conductive (or semi-conductive) through the introduction of a doping material for example boron (forming a p-type semiconductor) or nitrogen (forming an n-type semiconductor) or by surface treatment such as ion implantation with other doping agents. The insulating layer 14 generally covers the patterned layer 12 except at the edges of the patterned layer 12 and without overhang of the patterned layer 12 along a direction normal to a surface of the substrate 10 so as to permit later removal of wires without destruction or removal of the insulating layer 14.

Alternatively, complete layers of doped 12 and undoped diamond 14 may be grown on a substrate 10 which can be coated with a patterned layer of nickel, SiO2, or other material which resists reactive ion etching. Thus where no layer of nickel or other material exists, both layers of diamond are removed creating an exposed edge 12 which may be used as an electrode.

Figure 1B:
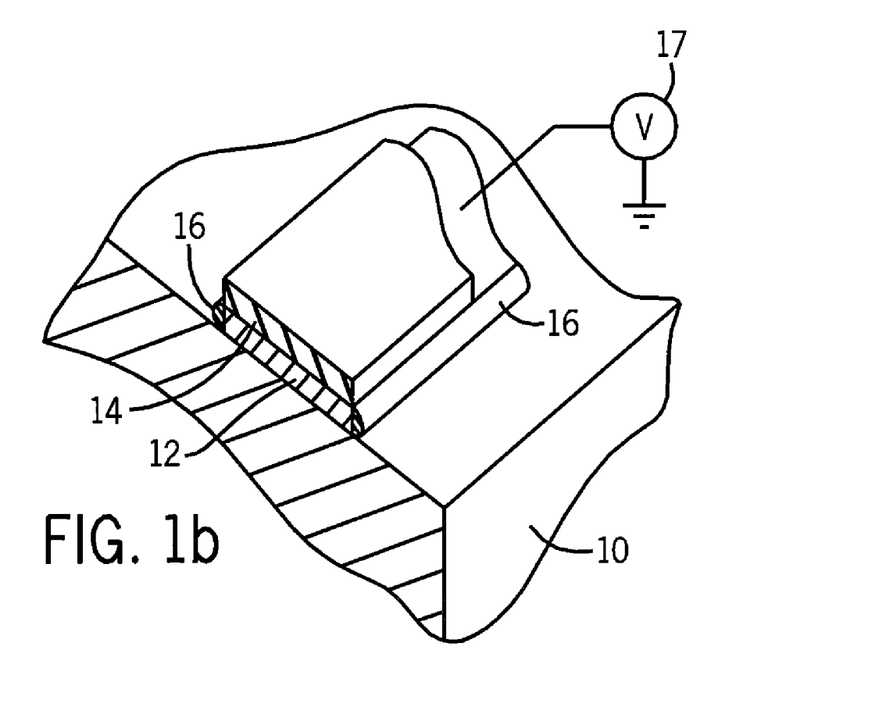

Referring now to FIG. 1b, a voltage source 17 may be connected to the layer 12 to grow, by electrodeposition, a wire 16 at the exposed step edge of the patterned layer 12. In one embodiment, the wire 16 may be tungsten which is catalytic to diamond but other materials may also be used. The size of the wire 16 is determined by the thickness of the patterned layer 12 and the duration of the growing process and thus may be easily controlled to nanoscale dimensions.

An optional super filling plating bath per T. Moffat, et al Electrochem. and Solid-State Lett., 5, 110 (2002) may be used to give even more growth to the wires. Further, after fabrication on the substrate 10 as described above, the wires 16 may be extended or joined by chemical vapor deposition processes to make insulators, semiconductors, metals, and alloys.

The size of the wire 16 may be much smaller than the dimensions of the patterned layer 12 allowing the latter to be produced by conventional lithography techniques that could not be used to directly produce the wire 16. In this way, for example, micron scale photolithography can be used to control nanoscale wires per Penner described above. However, the present technique permits reuse of the pattern both by eliminating the overhanging resist layer and through the use of a resilient pattern material.

The ultrananocrystalline diamond has a number of desirable features for this application as a pattern material. It has sufficient conductivity for acting as an electrode when doped and sufficient resistance when undoped to provide an insulator. It provides continuous high nucleation density, is robust against hydrogen and high temperatures, and has a large electrochemical window. Its strength and adhesion properties allow it to be used repeatedly with the removal of the wires 16.

Example I

It is believed that template of the substrate 10 layer 12 and insulating layer 14, produced as described, can be placed in a bath of 5 millimolar sodium tungstate solution with the conductive layer 12 biased at −1.11 volts with respect to the surrounding solution using an electrode in contact with the solution. The voltage may be applied in short pulses according to constant voltage "stop run chronoamperometry" techniques. The wires can then be reduced in a reduction atmosphere of hydrogen heated to 850 degrees Celsius to produce a pure metal.

Wires having a thickness of substantially 10 nm and thousands of nanometers in length have been produced in this fashion using Highly Oriented Pyrolytic Graphite instead of UNCD. To date this technique has been used to successfully produce wires from cobalt (using an ionic liquid), copper, tellurium, lead, and gold, zinc, platinum, palladium, cadmium, cadmium telluride, cadmium sulfide and zinc sulfide. It is anticipated that this technique may be used for depositing nanowires of any material that is capable of being electrodeposited. With the proven ability to utilize ionic liquids, refractory metals such as Ti, Nb, Zr, Ta and reactive metals such as Li, Na, K, Rb, Mg, Ca, and Al and intrinsic semiconductors such as Si Ge are expected to be possible. In addition most any binary, ternary or more complex materials such as III-V and II-VI semiconductors and superconductors should be capable of being electrodeposited.

Transfer of Wires

Figure 2A:
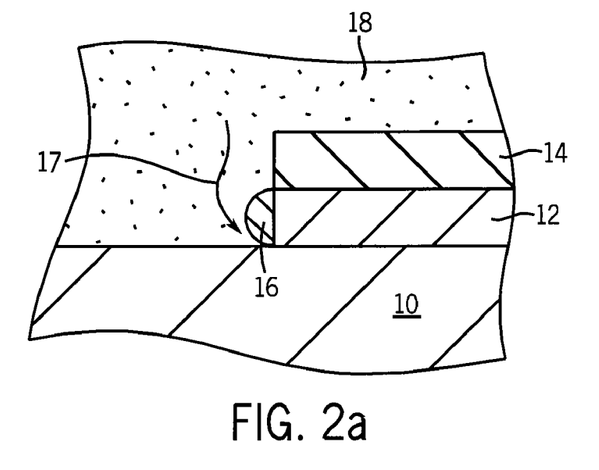
FIGS. 2a-2e are elevational views of a cross-section of FIG. 2 at multiple stages of a transfer process moving the fabricated wires to a second substrate to be combined with other fabricated wires in a complex pattern.

Referring now to FIG. 2a, after production of the wires 16, a transfer material 18 may be applied to the substrate 10 (to cover the insulating layer 14, the patterned layer 12 and the wires 16). This transfer material 18 may, for example, be a highly flowable polymer material such as PDMS, cyanoacrylate, polystyrene, epoxies, glue, tape or other material that may be used to adhere to the wire 16, including for example, formed-in-place ice. The transfer material 18 may flow under the wire 16 as indicated by arrow 17 to better remove the wire 16 as will be described. This underflow can be increased by placing the patterned layer on a pedestal (not shown) for example of insulator such as UNCD.

Figure 2B:
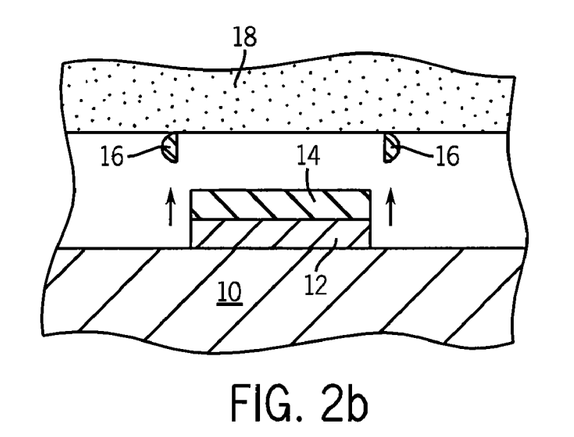
Figure 16:
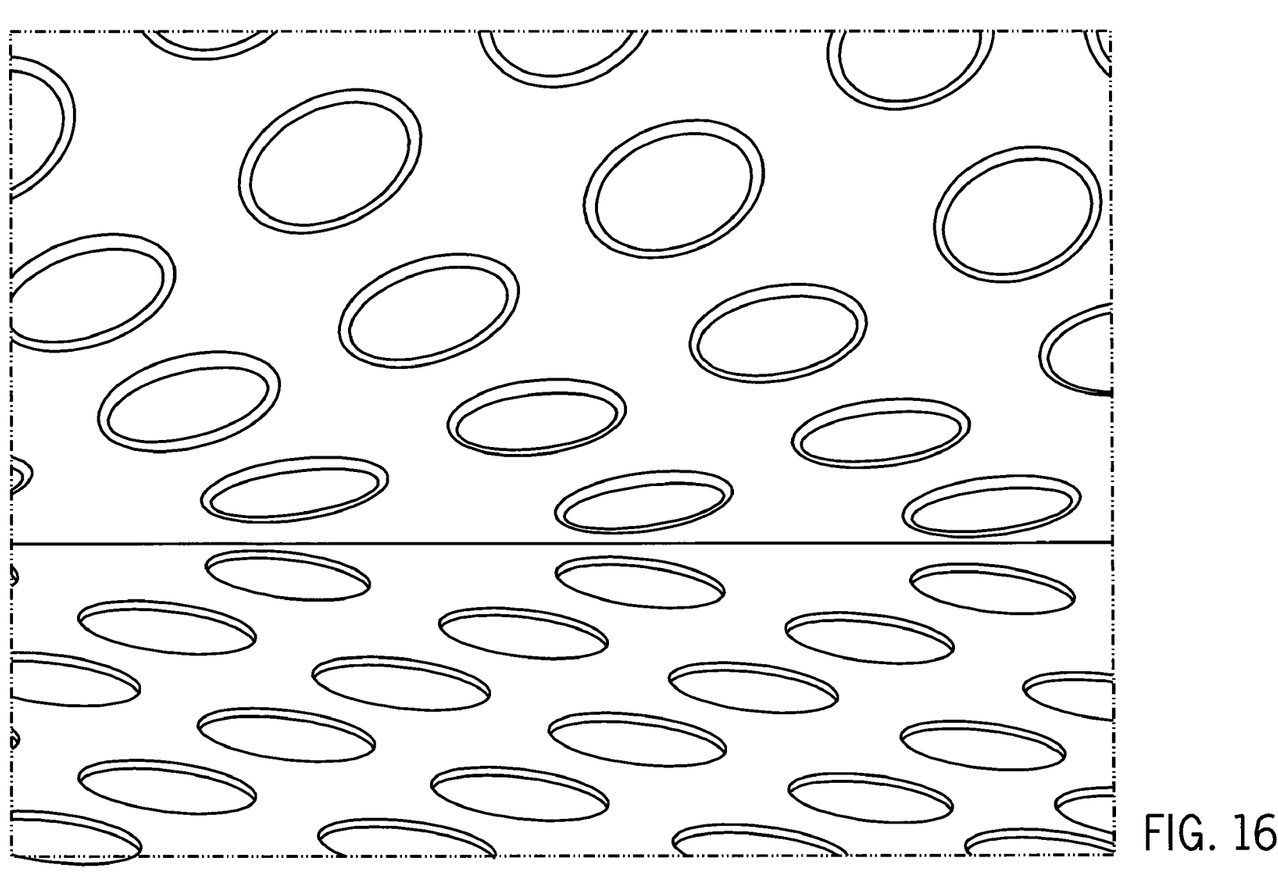
FIG. 16 is a photograph of microwires in the outline of loops produced by the present invention in the process of being stripped off of the pattern.
Figure 17:
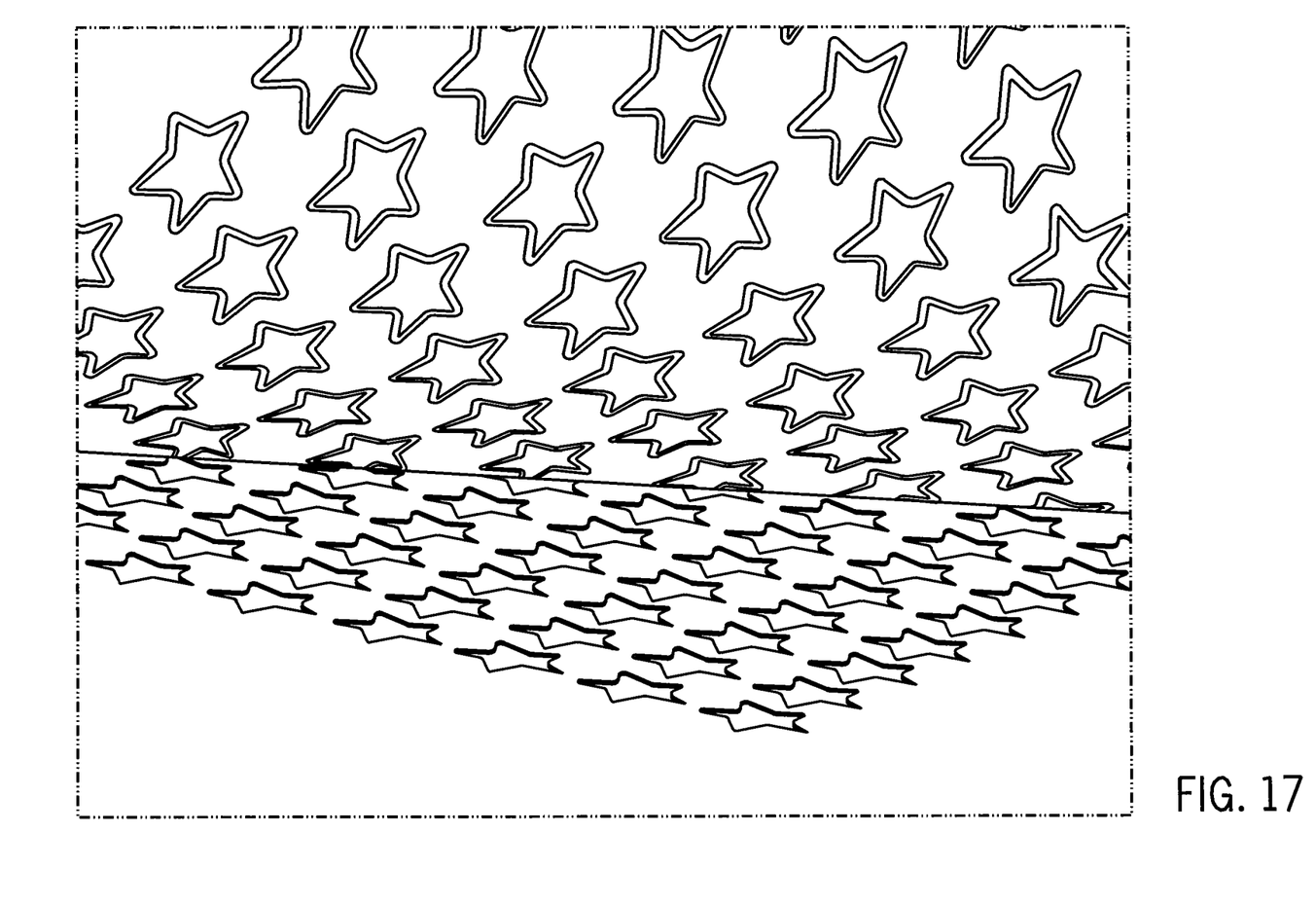
FIG. 17 is a photograph similar to that of FIG. 16 showing microwires in the outline of stars.

The transfer material 18 may then be pulled away from the substrate 10 as shown in FIG. 2b pulling the wire 16 away from the patterned layer 12 by means of a relatively greater cohesive force between the transfer material 18 and the wires 16 than between the wires 16 and the patterned layer 12. FIGS. 15 and 16 show wires 16 being removed from a substrate 12 using First Contact™ polymer commercially available from Photonic Cleaning Technologies of Platteville, Wis. USA.

Figure 2C:
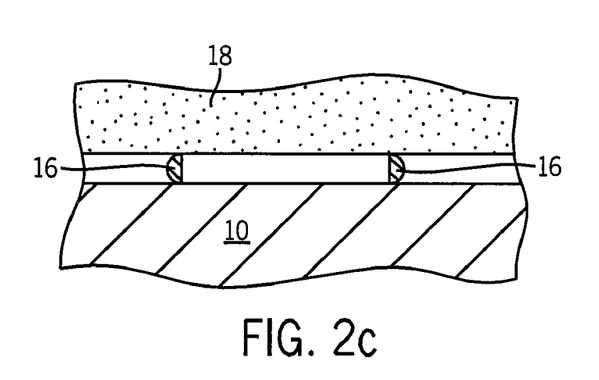

At this point, the transfer process may be complete and the transfer material 18 may serve as the substrate on which the wires 16 will be used. Alternatively however, as shown in FIG. 2c, the wires 16, as held by the transfer material 18, may then be placed against a second substrate 22 and retained on that second substrate 22 as the transfer material 18 is removed. This can be done in many ways, for example, by ensuring a greater cohesive force between the wires 16 and the second substrate 22 than between the wires 16 and the transfer material 18. This condition may be promoted by pretreating the second substrate 22 with an adhesive material or adhering the wires 16 to the second substrate 22 through pressure or heating or the like. Or the adhesive quality of the transfer material 18 may be decreased, for example, by flexure shear or melting. Alternatively, the transfer material 18 may be dissolved or eroded after the wires 16 are in place.

Figure 2D:
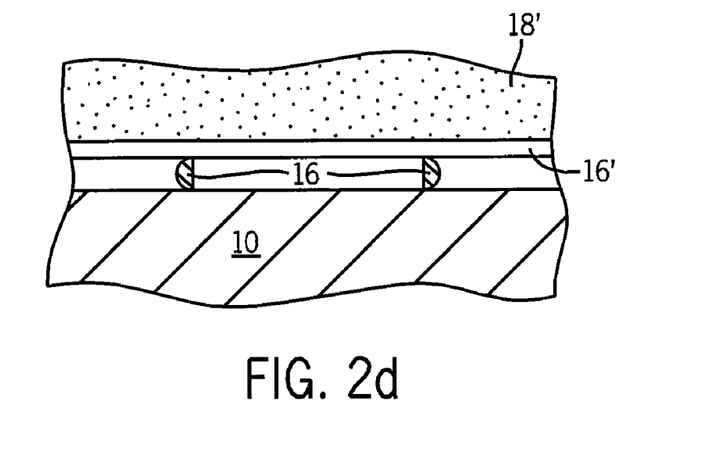
Figure 2E:
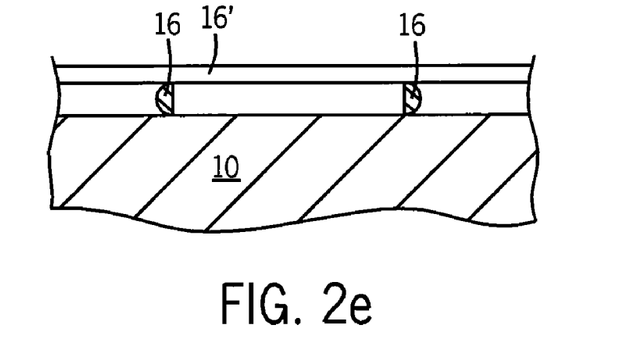

Subsequently as shown in FIG. 2d, an optional second set of wires 16' may be placed in a different orientation on top of the wires 16, for example, to provide electrical interconnections between wires 16, 16'. As will be described further below, through the use of the second UNCD electrode positions near the layer 12 but isolated electrically therefrom, portions of the wires 16 and 16' may be coated with second and third materials that when connected together provide a heterojunction or the like, or the wires 16 and 16' may be grown from different materials or differently treated to provide electrically active junctions.

Figure 3:
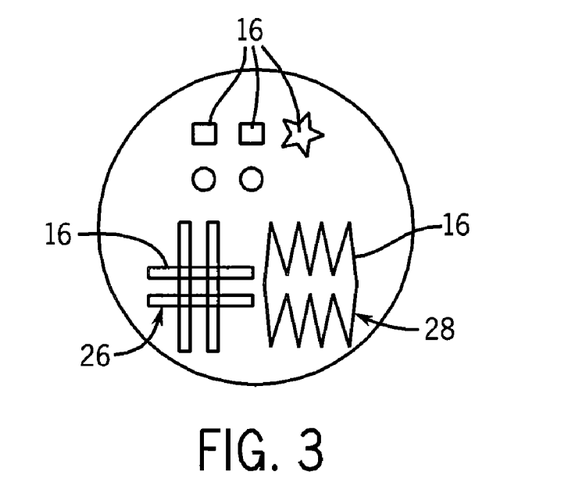
FIG. 3 is a top plan view of possible complex patterns that may be created by the process of FIG. 2.

Referring now to FIG. 3, this transfer process allows ESED techniques to produce complex arrays of wires 16, such as by combining a wire bridging element 24 extending between two parallel wires 16 or a grid 26 of crossing wires 16 or convoluted wire 28 such as might be used to create electrode sensors or electrical devices. The loop ends of the grid 26 of the convoluted wire 28 may be cut or etched away if separate conductors are desired.

Electrical Devices

Figure 4:
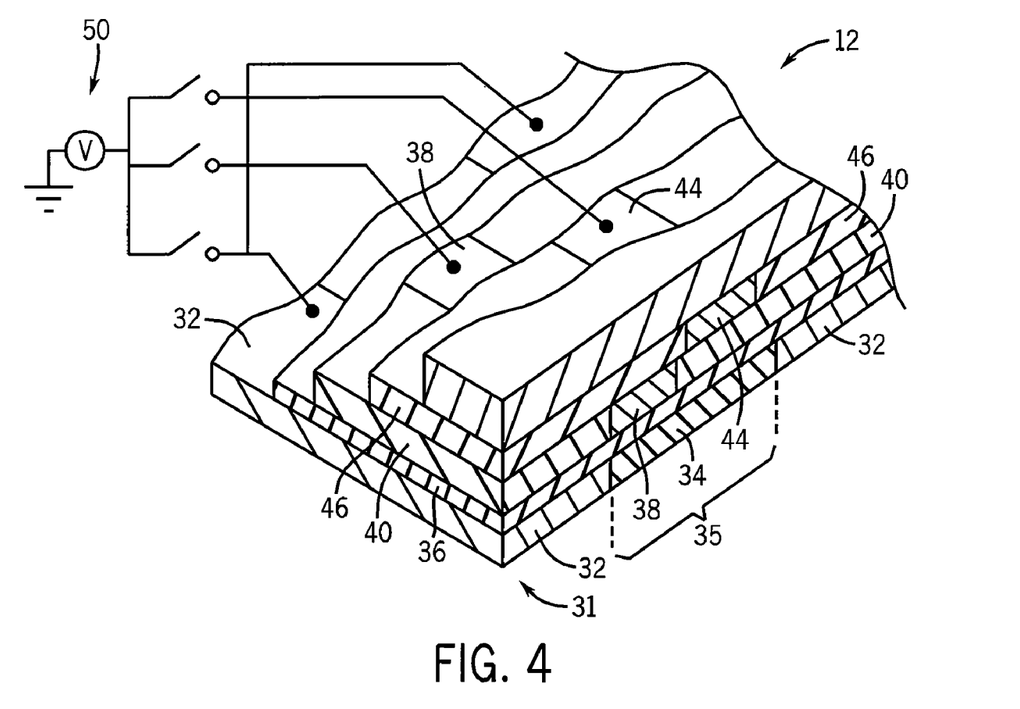
FIG. 4 is a figure similar to that of FIG. 2 showing a multilayer UNCD pattern having electrically independent conductors for electrodeposition.

Referring now to FIG. 4, the patterned layer 12 for creating the wires 16 may be quite complicated including, for example, a layer 32 of conductive UNCD presenting an edge 31 for growing a wire where the conductive layer 32 is broken by an insulating portion 34 defining a gap 35.

This layer 32 may coated with an insulating layer 36 also filling the gap 35. The insulating layer 36 may be in turn capped with a second conductive layer 38 positioned over a first portion of the gap 35 and flanked by insulating portions 40 so that the end of the layer 38 is exposed over part of the gap 35 in the edge 31.

A third conductive layer 44 may be positioned above the second conductive layer 38 so that conductive layer 44 is exposed over a different portion of gap 35 than conductive layer 38. Conductive layer 44 is flanked by insulation 46.

Each of the conductive layers 32, 38, and 44 may be electrically isolated from each other but, along the dimension of the edge, may form a nearly continuous conductive path.

Each of these conductive layers 32, 38, and 44 may be separately connected to a voltage source 50 to allow for separate electrochemical deposition at the particular conductive layers 32, 38, and 44.

Figure 5:
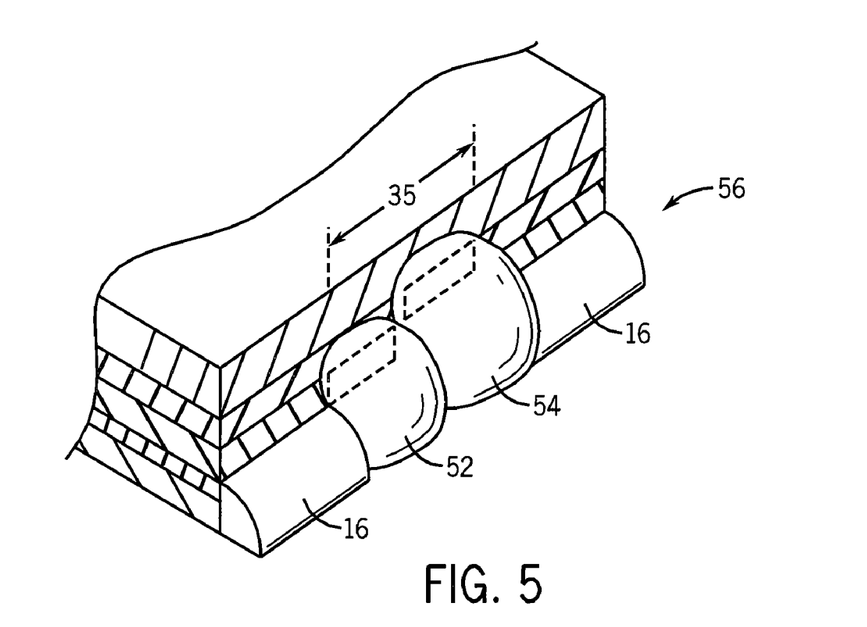
FIG. 5 is a figure similar to that of FIG. 3 showing a face of the multilayer UNCD pattern used to grow a heterogeneous wire, for example for an electrical device.

Referring now to FIG. 5, this process of selective activation of each of the conductive layers 32, 38, and 44 may be used to first grow a wire 16 (for example tungsten) at the edge of conductive layer 32 on either side of the gap 35. Next, a first junction element 52 of a different material (for example tungsten doped with a different material or a doped semiconductor or the like) may be grown on the exposed edge of layer 38 at one end of the gap 35 connected to one wire 16, and a second junction element 54 (also of a different material) may be grown at the exposed edge of layer 44 joined with junction element 52 and a second portion of the wire 16. Possible materials for first junction element 52 and the second junction element 54 include CdS, CdSe, CdTe, Al, CuO, ZnS, ZnSe, as well as others. The second junction element 54 may be grown until it touches the first junction element 52 as detected by a change in the observed voltage at electrode 38.

The two different junction elements 52 and 54 may also be dissimilar metals providing a thermocouple junction providing low mass, high response rate thermocouples. Alternatively, the junction elements 52 and 54 may be the same material applied at different times and subject to different doping conditions or maybe implemented by different materials of the wires 16 themselves. The heterojunction formed can be a photocell, a PN junction, a thermocouple, or other heterojunction of types known in the art.

In this way, a heterogeneous wire 56 may be formed so that electricity may flow through a first portion of the wire 16 to junction element 52 and then to a second junction element 54 and then to a second portion of the wire.

Wires as Substrates for Diamond

Figure 6:
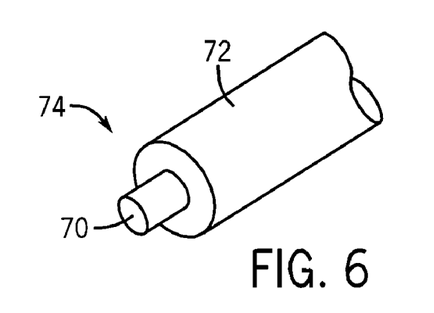
FIG. 6 is a perspective view of a tungsten wire produced per the present invention and subsequently treated to be coated with diamond.

Referring now to FIG. 6, more generally, the present invention may be used to create a wires 70 that may be used alone or (in the case of molybdenum or tungsten for example) as a substrate to grow a surrounding super hard material such as crystalline diamond layer 72 by supersaturation of carbon into the tungsten or molybdenum wire that is exuded as a crystalline diamond to create a clad wire 74. The tungsten wire 70 may then be removed by chemical processes to create crystalline diamond wires or left in place to provide a better interface for metallurgical bonding. Typically the diamond will not completely surround the wire as shown but will coat only one side when the process is conducted with the wire supported on its side. The clad wire 74 may be used, for example, as an electrical conductor with an insulator along its length, for example, to provide for an insulated microelectrode usable in medicine or the like.

Nanostructure Composites

Figure 7:
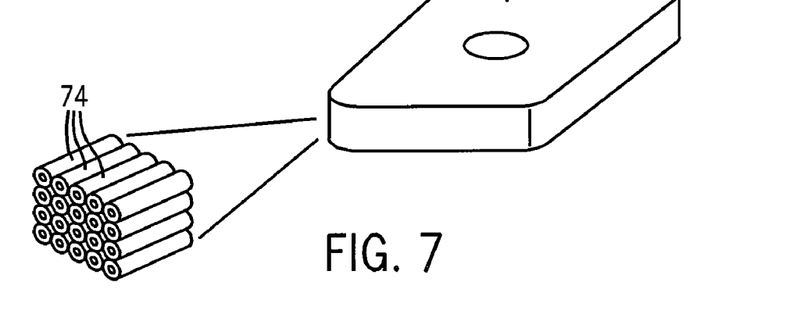
FIG. 7 is a perspective view of a cutting tool assembled of bundled wires of the type shown in FIG. 5.

Referring to FIG. 7, a set of these wires 74 may be sintered with metal particles into a cutting tool 80 optionally with an alignment to impart a directional hardness. The diamond coating is shown surrounding a wire core, but more typically only an upper surface of the wire will have a diamond coating when the wires are treated on one surface. The diamond outer claddings can be joined with Co, V, Fe, Ti, Nb or other transition metals, the latter which provide a binding matrix portion offering a ductility similar to a polymer with fiberglass. More generally, wires 74 may be combined with metal particles in metal injection molding techniques (MIM) in which particles coated with polymer are injection molded into complex shapes, the binding polymer removed and the metal particles sintered around the nanostructures. In these cases, both the metal particles and wires may be coated with a binder or only the metal particles may be coated with a binder.

Figure 8:
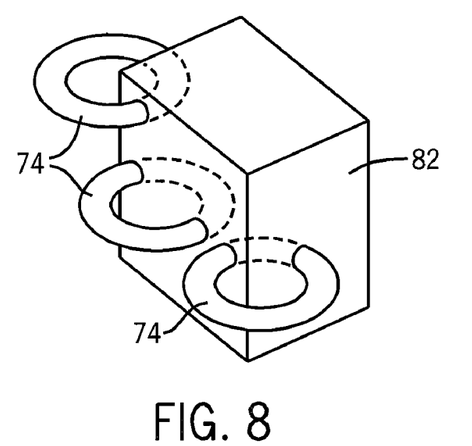
FIG. 8 is a fragmentary perspective view of a cutting tool showing nanostructures embedded in a cutting tool matrix.
Figure 9:
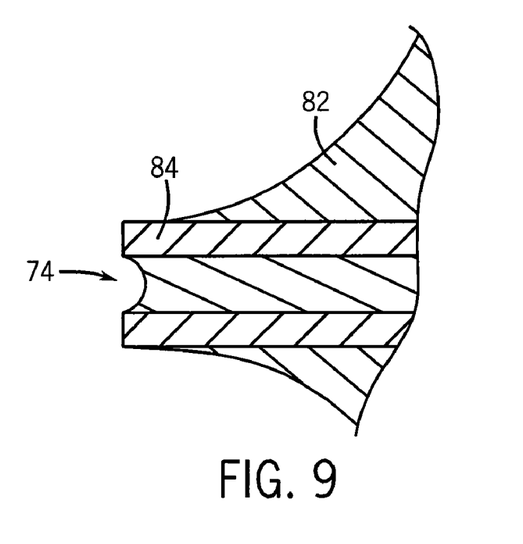
FIG. 9 is a fragmentary cross-section of the matrix material of a cutting tool abraded from around a wire showing the self-sharpening features anticipated in the inventive composite materials.

Referring also to FIG. 8, for the purpose of producing cutting tools but also for other composite materials, the wires 74 may be in the form of loops which better anchor the wires within the matrix material 82 particularly when they are partially exposed during abrasion of the tool. A similar effect may be obtained by patterning kinks in the wires 74. Referring to FIG. 9, the extremely hard outer diamond layer 84 of the wires 74 may provide a natural "cat's claw" self sharpening effect in which the matrix material 82 providing supporting resilience erodes preferentially around the diamond layer 84 to produce a nanoscale sharpened edge. The high thermal conductivity of diamond may also provide for assistance in preserving the cutting tool edge, beyond the effect of the hardness of the diamond or other superhard material.

The use of the diamond wires 74 need not be limited to this cutting tool but these wires may be used as a component for other types of powdered metallurgy or may be used to create composites in the manner analogous to fiberglass/polymer composites with the diamond wires distributed within a matrix of sintered materials or polymers or other matrices.

Diamond wires are heat resistant and have high thermal conductivity (four times that of copper) and so may be used in material applications requiring high temperature resistance or conductivity. High thermal transfer may help produce fire resistant materials. Diamond wires may also be useful for materials that must be scratch resistant. Diamond wires may be useful to alter the electrical characteristics of materials or to create sensors.

Mass Production of Nanostructures

Figure 10:
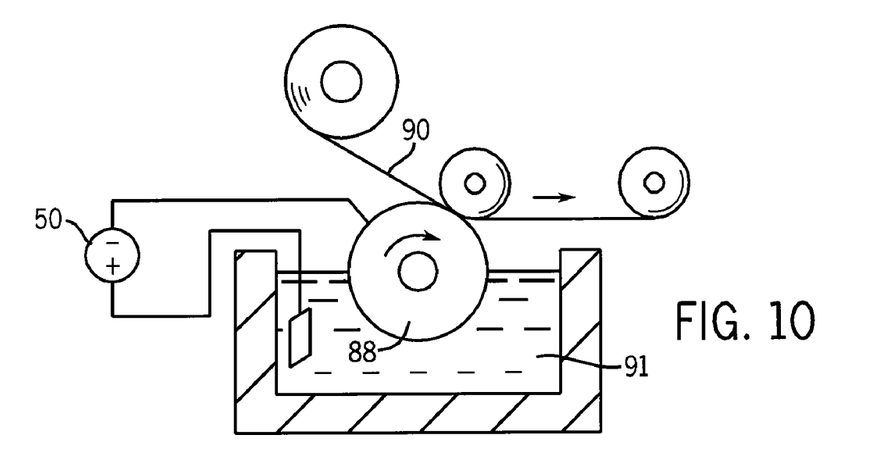
FIG. 10 is a simplified depiction of a continuous manufacturing process using the technique of the present invention to create nanostructures on a rotating drum and extract them using a tape reel.
Figure 11:
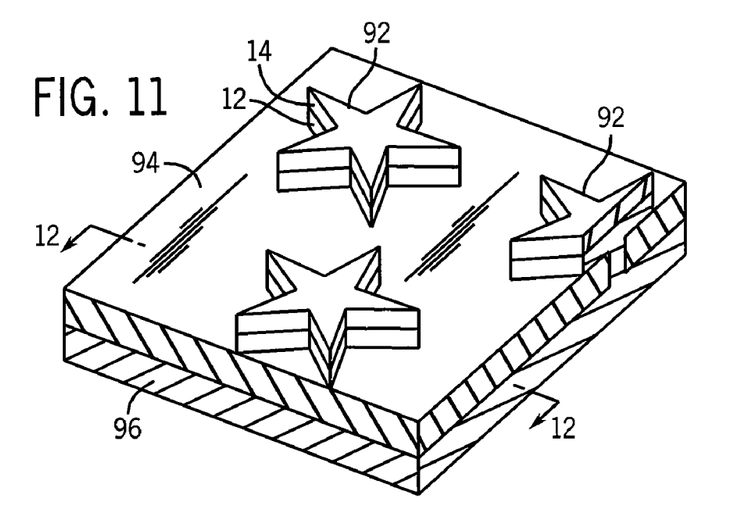
FIG. 11 is a perspective fragmentary view of the surface of the drum of FIG. 10 having a pattern to form nanostructure loops of non-convex polygons.

Referring now to FIG. 10, mass production of the nanostructures for the above purposes, for example, may be done using a rotating cylinder 88 providing a template as described above exposed on the outer circumference of the cylinder. Referring to FIG. 11, the outer surface of the cylinder, for example, may have multiple isolated islands 92, exposing edge layers 12 following an outline of non-convex polygons. Roughly, $10^{10}$ identical 500 nm rings or ovals or other shapes can be manufactured on a 4-inch area. And because the pattern on is not consumed in this process mass production of nanostructures is rendered practical.

Figure 12:
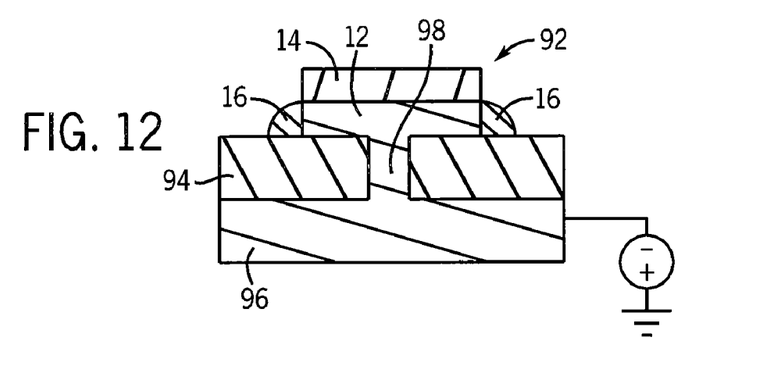
FIG. 12 is a cross-section along line 12-12 of FIG. 11 showing a conductive via system electrically joining the patterns of FIG. 11.

The edge layers 12 may be covered with non-overhanging insulating layers 14 of common dimension and placed on a second insulating layer 94 (for example non-doped UNCD) providing a planar substrate over top of a conductive layer 96. As shown in FIG. 12, a conductive via 98 may pass upward from the conductive layer 96 through the insulating layer 94 to layer 12 of each of the islands 92 to provide common electrical connection permitting the growth of loops around the islands 92.

The conductive layer 96 may be connected to a biasing power source 50 by means of a slip ring or other similar system. The cylinder 88 may be rotated by a motor (not shown) through a bath 91 of electrochemical solution providing material of the nanostructures so that they form on its outer surface as the cylinder 88 during the time a portion of the cylinder 88 is immersed.

An adhesive material 90 such as tape may be applied to the exposed portion of the cylinder 88 after the nanostructures are grown to remove the nanostructures. The nanostructures may be removed from the tape by a variety of means including a solvent bath acting on the adhesive, mechanical scraping, or burning of the tape.

Improved Solar Cell

Figure 13:
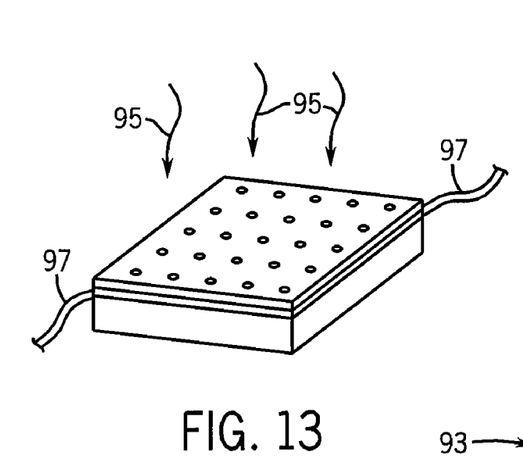
FIG. 13 is a perspective view of a solar cell constructed using principles of the present invention using UNCD.
Figure 14:
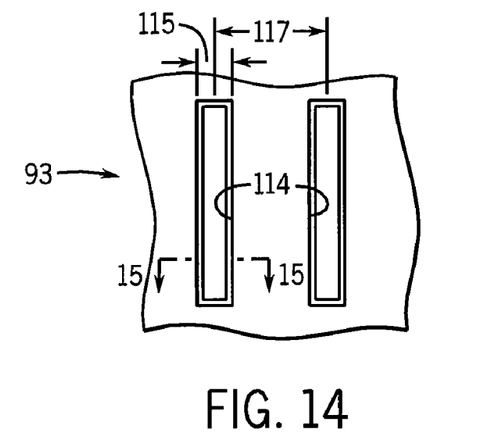
FIG. 14 of the top plan detailed view of the solar cell of FIG. 13 showing a spacing of holes having deposited photoelectrically active materials.
Figure 15:
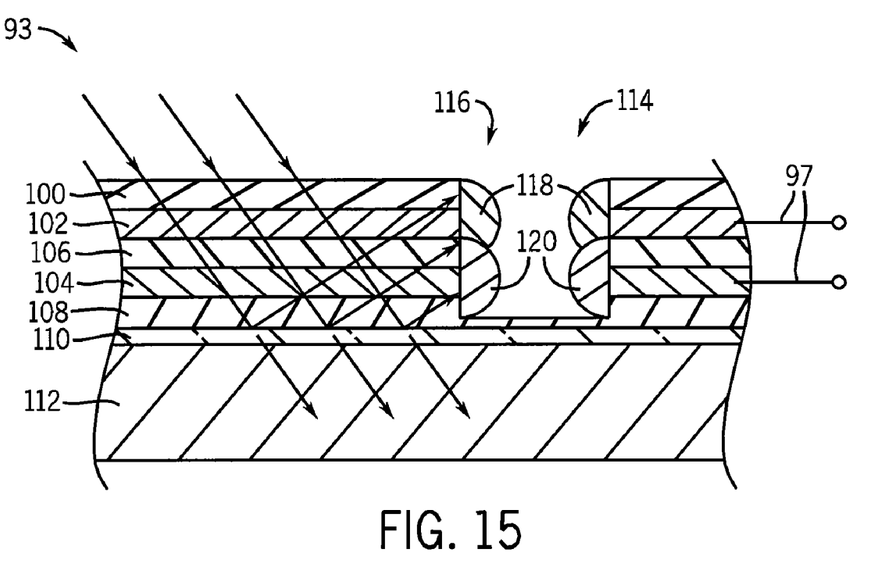
FIG. 15 is a cross-sectional view along line 15-15 of FIG. 14.

Referring now to FIG. 13, the techniques of the present invention may be used to produce an improved solar cell 93 receiving light 95 at an upper planar surface and providing electrical voltage at electrodes 97. Referring also to FIGS. 14 and 15, the planar upper surface may include a first outer layer of insulating UNCD 100 over top of a conductive layer 102 of UNCD which in turn is separated from a second conductive layer 104 of UNCD by an insulating layer 106 of UNCD. The second conductive layer 104 may rest on a final non-conductive layer 108 of UNCD, in turn, resting on a tungsten film 110 placed on top of a substrate 112, for example, a silicon wafer. The effect is to provide for two electrically isolated conductive layers 102 and 104 which may connect to the electrodes 97 respectively to conduct electricity from the solar cell 93.

Referring specifically to FIG. 14, the surface of the solar cell 93 may be punctured by a set of spaced holes 114 through the transparent layers 100-110 and separated by unpunctured areas of the transparent layers 100-110. The size 115 of the holes 114 and their spacing 117 may be adjusted to optimize the light collection area versus the electrical generation area of the solar cell as will now be described. In one embodiment, the holes may be slots extending across the direction of light conduction to better capture the light, or the holes may be shaped to promote focusing of light reflected off of the edges of the holes onto previous or adjacent holes.

As shown in FIG. 15, each of the holes 114 presents inner edges having areas substantially perpendicular to the face of the substrate 112 upon which may be grown photo electrically active heterojunction materials 116. For example, one material 118 may be cadmium telluride formed in a toroid within hole 114 grown around the exposed layer 102 as described above and the other material 120 cadmium sulfide formed in an adjacent abutting toroid and grown about layer 104. Light 95 entering transparent layers 100-110 is trapped by internal reflection and conducted to the various holes 114 where electrical power is generated at the heterojunctions and extracted through electrodes 97.

The hole may be formed using reactive ion etching that cuts only about halfway through layer 104. This allows the layers 100-104 to be detached from the substrate 112 by a KOH etching of the silicon of the substrate 112, for example. The layer 108 may then be removed and replaced with an antireflection layer (not shown) and layers 100-104 placed over a thermal solar panel. Long wavelength light may pass through layer 104 or the anti reflective coating currently not shown providing for heating, for example, for a solar thermal (hot water) collector.

Because the collection area of the heterojunctions between materials 118 and 120 is vertically disposed, the blockage of sunlight is correspondingly reduced. This design may be augmented with grown in place wires to provide lower electrical resistivity for the collection of the electrical power. This design does not have any metallic conductors that also shade the solar cell (need reference here to a paper that showed a few percent boost in efficiency due to smaller metal contacts. This has zero metal contacts that shade the active areas.

The thin film of diamond provided by layers 100-110 may provide useful spectral separation allowing different heterojunctions to be tuned to different frequency bands. Significantly, the diamond also provides a robust outer surface that will not degrade and is resistant to environmental contamination. Diamond may provide advantageous thermal conductivity properties with respect to transmitting heat to the substrate 112.

"Nanowire" as used herein means a wire with a cross-sectional area less than 1000 nm$^2$ and more typically a dimension of less than 100 nm in cross-section and with a length of at least 10 times its cross-sectional dimension and typically more than 1000 nm long.

"Microwire" as used herein means a wire with a cross-sectional area less than 1000 µm$^2$ and more typically a dimension of less than 100 µm in cross-section and with a length of at least 10 times its cross-sectional dimension and typically more than 1000 µm long.

"Conductive" and "conductor" are intended to cover materials that are non-insulating as that term is generally understood and therefore to include semiconductive materials.

It is specifically intended that the present invention not be limited to the embodiments and illustrations contained herein, but include modified forms of those embodiments including portions of the embodiments and combinations of elements of different embodiments as come within the scope of the following claims

I claim:

1. A method of constructing nanowires and microwires comprising the steps of:
    (a) applying a pattern of conductive diamond to a substrate, the pattern of conductive diamond providing edges of conductive diamond at desired locations of wires, the edges extending generally away from a surface of the substrate;
    (b) immersing the pattern in at least one solution containing an electrochemically depositable first material; and
    (c) controlling an application of an electrical potential between the conductive diamond and the solution to electrically deposit the first material along an edge to grow the wires.

2. The method of claim 1 further including the step of:
    providing an insulating coating over the pattern exclusive of at least one edge.

3. The method of claim 2 wherein the conductive diamond is diamond having a doping material and the insulating coating is diamond without the doping material.

4. The method of claim 1 further including the step of transferring the wires from the diamond to a second substrate.

5. The method of claim 4 wherein the transfer includes steps of:
    (i) applying a cohesive material to the wires on the substrate;
    (ii) removing the cohesive from the substrate material to pull the wires from the substrate;
    (iii) applying the cohesive material and wires to the second substrate; and
    (iv) removing the cohesive material and leaving the wires on the second substrate.

6. The method of claim 5 further including the step of repeating steps (i) and (iv) for a given pattern and different second substrates.

7. The method of claim 4 further wherein the transfer includes the steps of:
    (i) applying a material to the wires on the substrate
    (ii) removing the material to pull the wires from the substrate,
    wherein the material is the second substrate.

8. The method of claim 1 wherein steps (b) and (c) are repeated to deposit multiple electrochemically depositable materials along the edge to produce a heterogeneous nanoconductor.

9. The method of claim 8 wherein the pattern of conductive diamond includes multiple electrically conductive portions separated by insulated portions further including the steps of
 (d) immersing the pattern in the at least one solution containing an electrochemically depositable second material; and
 (e) controlling the application of an electrical potential between the second conductive portion and the second solution to electrically deposit the second material and electrical communication with the first material.

10. A method of constructing nanowires and microwires comprising the steps of:
 (a) applying diamond conductor to a substrate, the diamond conductor providing edges at desired locations of wires;
 (b) immersing the pattern in a solution containing an electrochemically depositable material; and
 (c) controlling an application of an electrical potential between the edges and the solution to electrically deposit the material along at least a portion of the edges to grow the wire.
 (d) applying a cohesive material to the wires on the substrate;
 (e) removing the cohesive from the substrate material to pull the wires from the substrate;
 (f) repeating steps (d) and (e) for a given pattern and different second substrates.

* * * * *

UNITED STATES PATENT AND TRADEMARK OFFICE
CERTIFICATE OF CORRECTION

PATENT NO. : 8,236,386 B2  Page 1 of 1
APPLICATION NO. : 12/358801
DATED : August 7, 2012
INVENTOR(S) : Michael Zach It is certified that error appears in the above-identified patent and that said Letters Patent is hereby corrected as shown below:

IN THE CLAIMS:

CLAIM 9, column 11, line 4, delete "the steps of"

Signed and Sealed this
Thirteenth Day of November, 2012

David J. Kappos
*Director of the United States Patent and Trademark Office*